United States Patent [19]
Pax et al.

[11] Patent Number: 6,021,503
[45] Date of Patent: *Feb. 1, 2000

[54] BIT SYNCHRONIZATION FOR INTERROGATOR

[75] Inventors: George E. Pax, Boise; David K. Ovard, Meridian, both of Id.

[73] Assignee: Micron Communications, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/781,884

[22] Filed: Dec. 21, 1996

[51] Int. Cl.⁷ ........................................................ G06F 1/04
[52] U.S. Cl. ............................ 713/400; 713/502; 713/503
[58] Field of Search ..................... 395/551, 552, 395/555, 556, 557, 558, 559; 364/550, 556; 340/505, 825.14; 713/400, 401, 502, 503, 600

[56] References Cited

U.S. PATENT DOCUMENTS

| | | | |
|---|---|---|---|
| 5,487,090 | 1/1996 | Ide | 375/316 |
| 5,513,377 | 4/1996 | Capowski et al. | 395/881 |
| 5,694,068 | 12/1997 | Rokugo | 327/159 |
| 5,694,441 | 12/1997 | Suzuki | 375/362 |

*Primary Examiner*—Dennis M. Butler
*Attorney, Agent, or Firm*—Nixon & Vanderhye P.C.

[57] ABSTRACT

A bit synchronization device for an interrogator in a remote intelligent communication system wherein a programmable divider extracts a bit clock from the bits in a bitstream using a clock rate 64 times the data rate and wherein the divider is responsive to an early/late detector for adding or subtracting a count from the divider counter.

19 Claims, 10 Drawing Sheets

BIT SYNCHRONIZATION FOR INTERROGATOR

FIELD OF THE INVENTION

The presently disclosed subject matter relates to bit synchronization for use in an interrogator in a remote intelligent communication system.

BACKGROUND OF THE INVENTION

Figure 1:
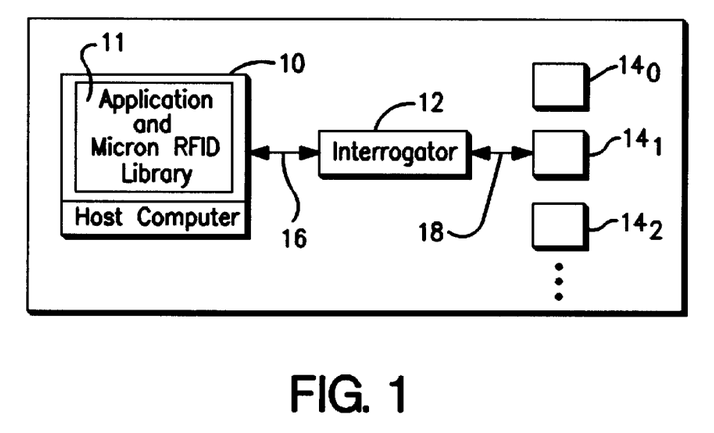
FIG. 1 is a simplified block diagram of a remote communications system for selectively communicating with a particular remote intelligent communication device.

In a remote intelligent communication system, with reference to FIG. 1, a host computer 10 communicates across a given communication medium 18 with a selected remote intelligent communications device $14_1$ of a plurality of remote intelligent communication devices $14_0$, $14_1$, $14_2$. An interrogator 12 is employed intermediate a host computer 10 and a communications medium 18 for appropriately coupling the host computer 10 to the medium 18. Host computer 10 has a library of commands 11 available for configuring and operating the interrogator 12, the remote intelligent communications device 14, and itself.

In an exemplary application, host computer 10, via appropriate programming, retrieves appropriate commands from within its library of commands 11 and sends associated command data to interrogator 12 by way of a digital interfacing link 16. Digital interfacing link 16 is an enhanced parallel port (EPP) digital interface. The command forwarded from host 10 to interrogator 12 can be a command for configuring the interrogator, or command for operating interrogator 12, or a command for configuring or operating a remote intelligent communications device 14.

Upon receiving the command, interrogator 12 configures itself appropriately in accordance with the command instructions and/or forwards appropriate data along a forward RF communications link 18 to remote intelligent communications device 14. Depending upon the type of command, the remote intelligent communications device 14 may respond with an appropriate return RF transmission 18. If such a reply is received, interrogator 12 extracts digital data from the RF reply signal and forwards the reply message to host computer 10 for further analysis.

Preferably, host computer 10 is a computer compatible with Microsoft DOS™ and has a processor performance equal to or greater than an 80486™ processor. Additionally, host computer 10 has an enhanced parallel port (EPP) for providing a digital interface 16 with interrogator 12. A library of commands for operating interrogator 12 and remote intelligent communication devices 14, are available in a software tool "Micron RFID Library (MRL)" available from Micron Communications, Inc. of Boise, Id.

Remote intelligent communications device 14 may comprise an Ambit™ remote intelligent communications device, available from Micron Communications Inc. of Boise, Id.

Interrogator 12 receives digital data by way of digital interfacing port 16 (e.g., EPP). Certain commands of the "Micron RFID Library" are associated with configuring interrogator 12. For example, interrogator 12 may receive a command for structuring appropriate transmit and receive antenna structures. A receive antenna structure may include two or more separate antennas selectively configurable for receiving an RF signal. Likewise, transmitting antennas are selectively configurable for enabling two or more transmission of RF signals away from interrogator 12. In this regard, diversity switches of the transmit and receiver communication paths are respectively configurable in accordance with configuration data received from a digital controller. The diversity switches configures the respective antenna structures of the receiver and transmitter communication links of interrogator 12.

Interrogator 12 additionally splits the return signal and mixes one side with the reference signal and one side with the reference signal shifted by 180° to produce quadrature signals I and Q as well as including a demodulator providing differential decoding of the data wherein phases that differ represent a 0 data bit and phases that agree represent a 1 data bit.

Further details of the above-noted communication system can be found in co-pending commonly assigned application Ser. No. 08/656,530, now U.S. Pat. No. 5,894,266 which is hereby incorporated by reference in its entirety.

SUMMARY OF THE INVENTION

The present invention pertains to a bit synchronizer for use with an interrogator of a remote intelligent communication system of the above-noted type wherein the demodulated output data is input to a novel bit synchronizer for recovery of the data clock. Moreover, the bit synchronizer includes error generation for modifying a programmable divider which outputs the data bit clock signal. In this regard, in an exemplary embodiment, an up/down counter responsive to the demodulated data at a high frequency clock signal (64 times the data rate) measures where the data bit clock signal is with respect to a transition in the data as well as additional circuitry for determining whether the data bit clock recovered is early or late. If the clock measured by the up/down counter is determined to be late, the programmable divider is decremented by one. Moreover, if the clock signal is determined to be early, the programmable divider is incremented so as to provide a longer countdown interval. Still further, if no early or late error is detected, the divider countdown period (64 clock pulses) it remains unchanged.

BRIEF DESCRIPTION OF THE DRAWINGS

The above-noted and other features of the present invention will be better and more completely understood by studying the following detailed description of presently preferred embodiments together with the appended drawings, of which.

DETAILED DESCRIPTION OF PREFERRED EMBODIMENTS

Figure 2:
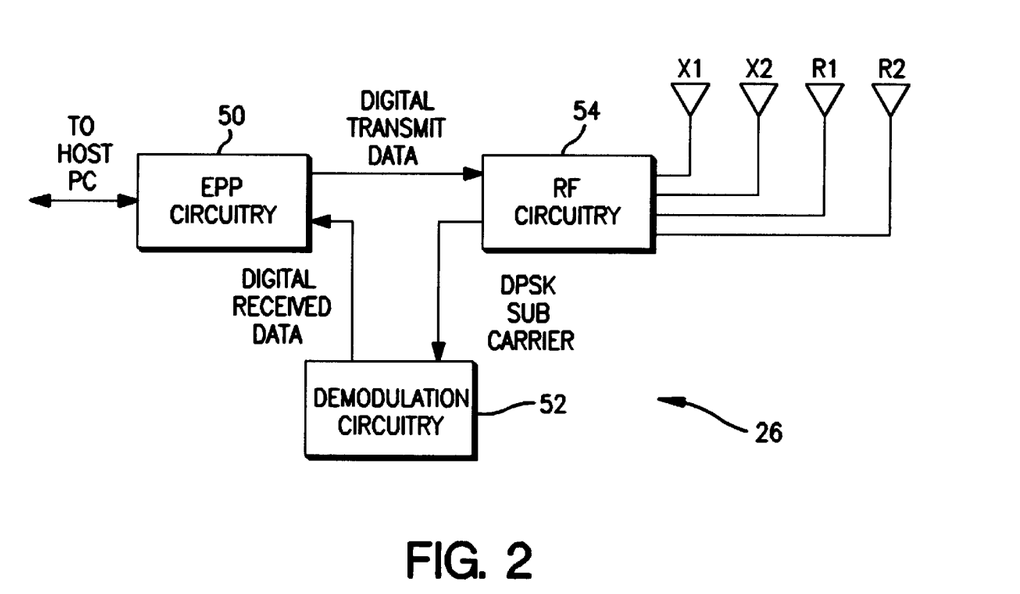
FIG. 2 is a simplified block diagram of an exemplary interrogator.

The interrogator 26 of FIG. 2, which may be used in a communications system as in FIG. 1, includes enhanced parallel port (EPP) circuitry 50, differential demodulation circuitry 52, and RF (radio frequency) circuitry 54, as well as a power supply (not shown) and a housing or chassis (not shown). In the illustrated embodiment, the enhanced parallel port circuitry 50, the demodulator circuitry 52, and the RF circuitry 54 respectively define circuit card assemblies (CCAs). The interrogator uses an IEEE-1284 compatible port in EPP mode to communicate with the host computer 48. The EPP circuitry 50 provides all the digital logic required to coordinate sending and receiving a message with a transponder 14. The EPP circuitry 50 buffers data to transmit from the host computer 10, converts the data to serial data, and encodes it. The EPP circuitry 50 then waits for data from the transponder 14, converts it to parallel, and transfers it to the host computer 10. In one embodiment, messages include up to 64 bytes of data.

The EPP mode interface provides an asynchronous, interlocked, byte wide, bi-directional channel controlled by a host device. The EPP mode allows the host computer to transfer, at high speed, a data byte to/from the interrogator.

Figure 3:
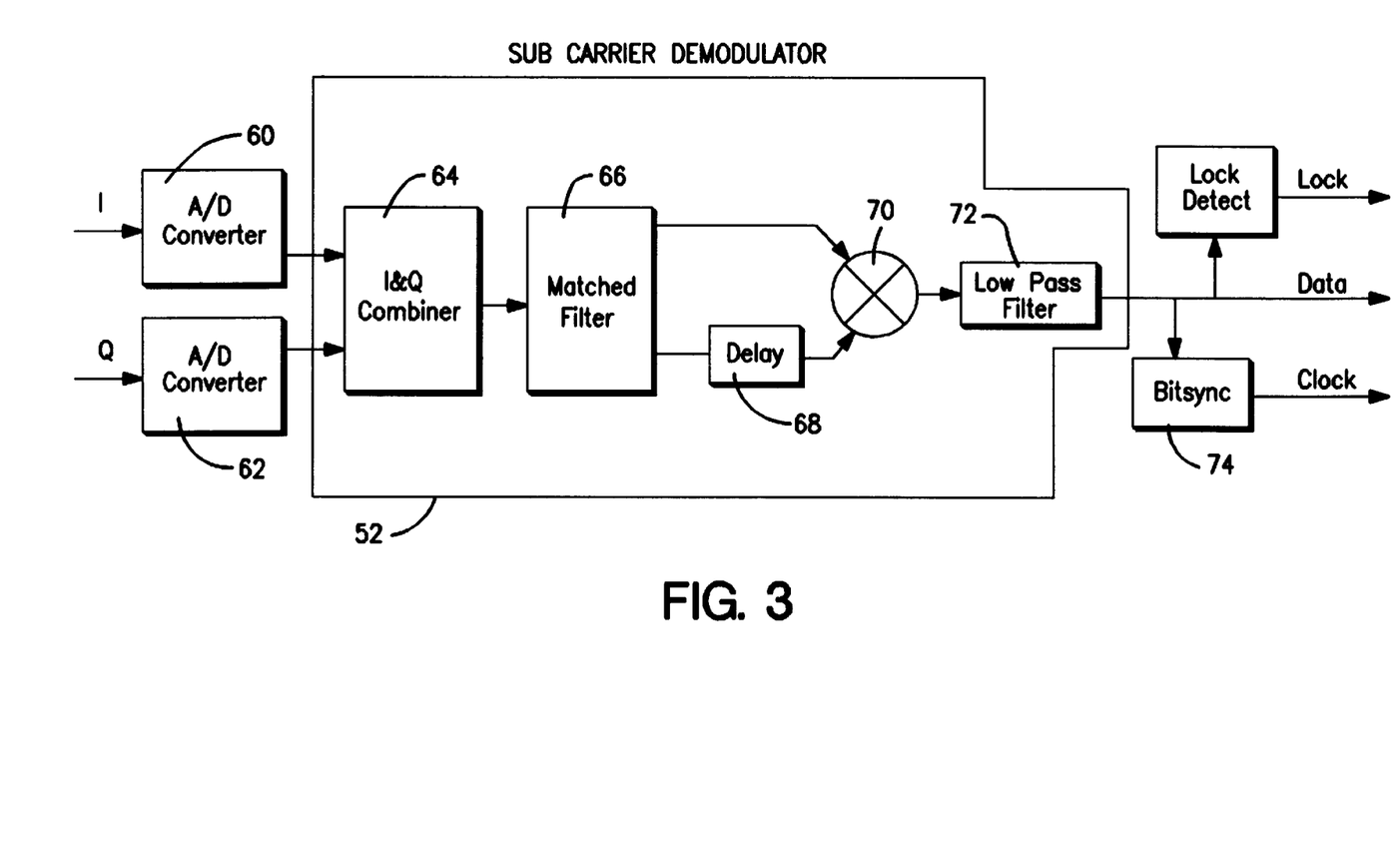
FIG. 3 is a more detailed illustration of the exemplary demodulation circuitry of FIG. 2.

The differential demodulator circuitry illustrated in FIG. 3 (which is merely exemplary and not limiting) receives signals I and Q from the RF circuitry 54, which signals are differentially encoded (DPSK). The demodulator circuitry 52 includes analog to digital (A/D) converters 60 and 62 respectively converting the I and Q signals from analog to digital signals. The exemplary circuitry 52 further includes a combiner 64 coupled to the A/D converters 60 and 62, for combining the digital signals. Circuitry 52 further includes a FIR matched filter 66, coupled to the combiner 64, for improving the signal to noise ratio. Demodulator circuitry 52 further includes delay circuitry 68 and multiplier circuitry 70 coupled to the FIR matched filter 66 for delaying the signal and multiplying the present signal with the delayed signal to remove the sub-carrier. Still further, a low pass filter circuitry 72, coupled to the multiplier 70, is included for filtering the output of the multiplier 70 to remove the 2 times the sub-carrier frequency component. The circuitry 52 still further includes a bit synchronizer 74 coupled to the filter 72 for regeneration of the data clock. The data, clock, and lock detect signals are sent to the EPP circuitry 50.

Further details of the above-noted exemplary demodulation circuit can be found in co-pending commonly assigned application Ser. No. 60/033,829, now U.S. Pat. No. 5,896,060, which is hereby incorporated by reference in its entirety.

Figure 4:
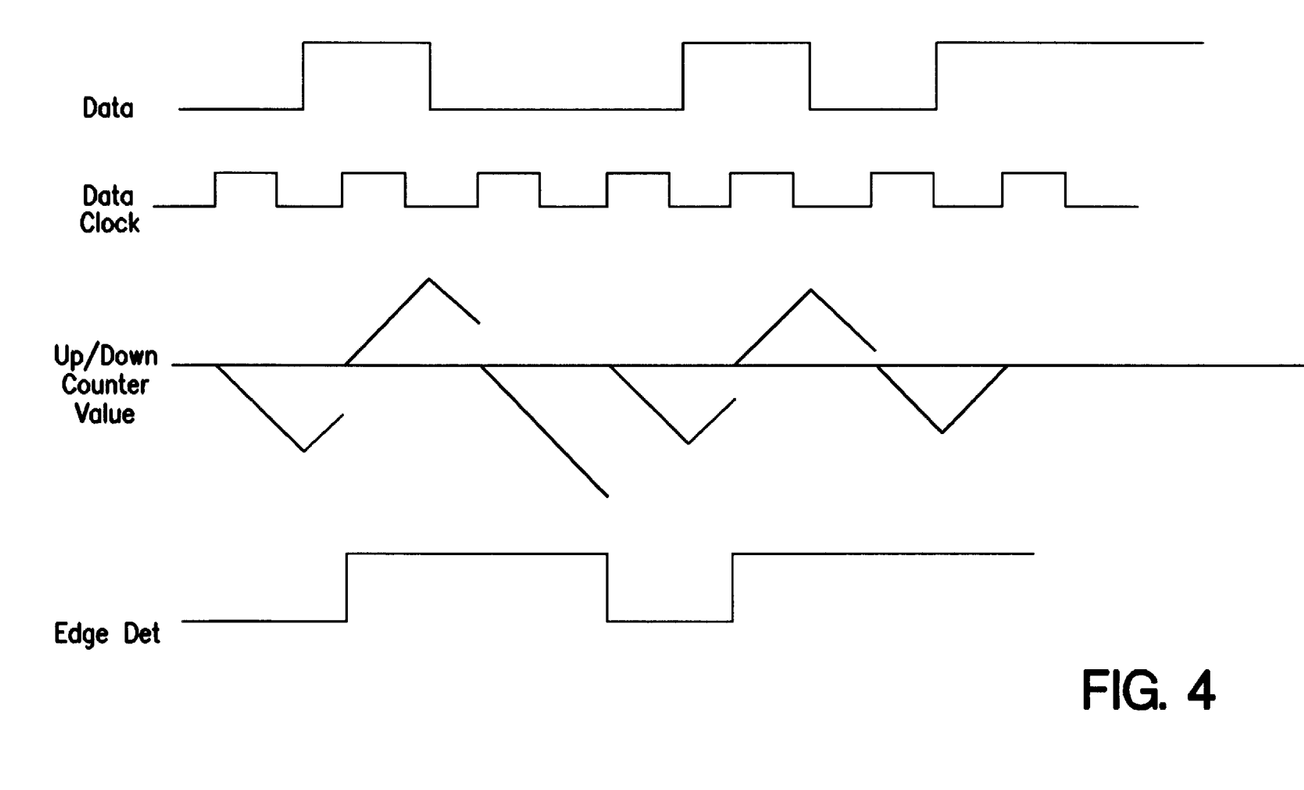
FIG. 4 is a timing diagram of the bit synchronizer of FIG. 3.

The data signal illustrated in FIG. 4 is representative of bit stream data extracted by the demodulator from the combined I and Q channels by comparing the phase of the current sample point with the corresponding point in a previous bit. Where there is a valid comparison between sample points, a positive peak results which is representative of a 1 data bit. Where there is no valid comparison of the sample points, a negative peak results representative of a 0 bit. Thus, differential decoding of the data is obtained. In this regard although a particular demodulator has been illustrated, it is merely exemplary and the present invention for generating the data clock by sampling the data near its peak is useful with other demodulators.

Figure 5:
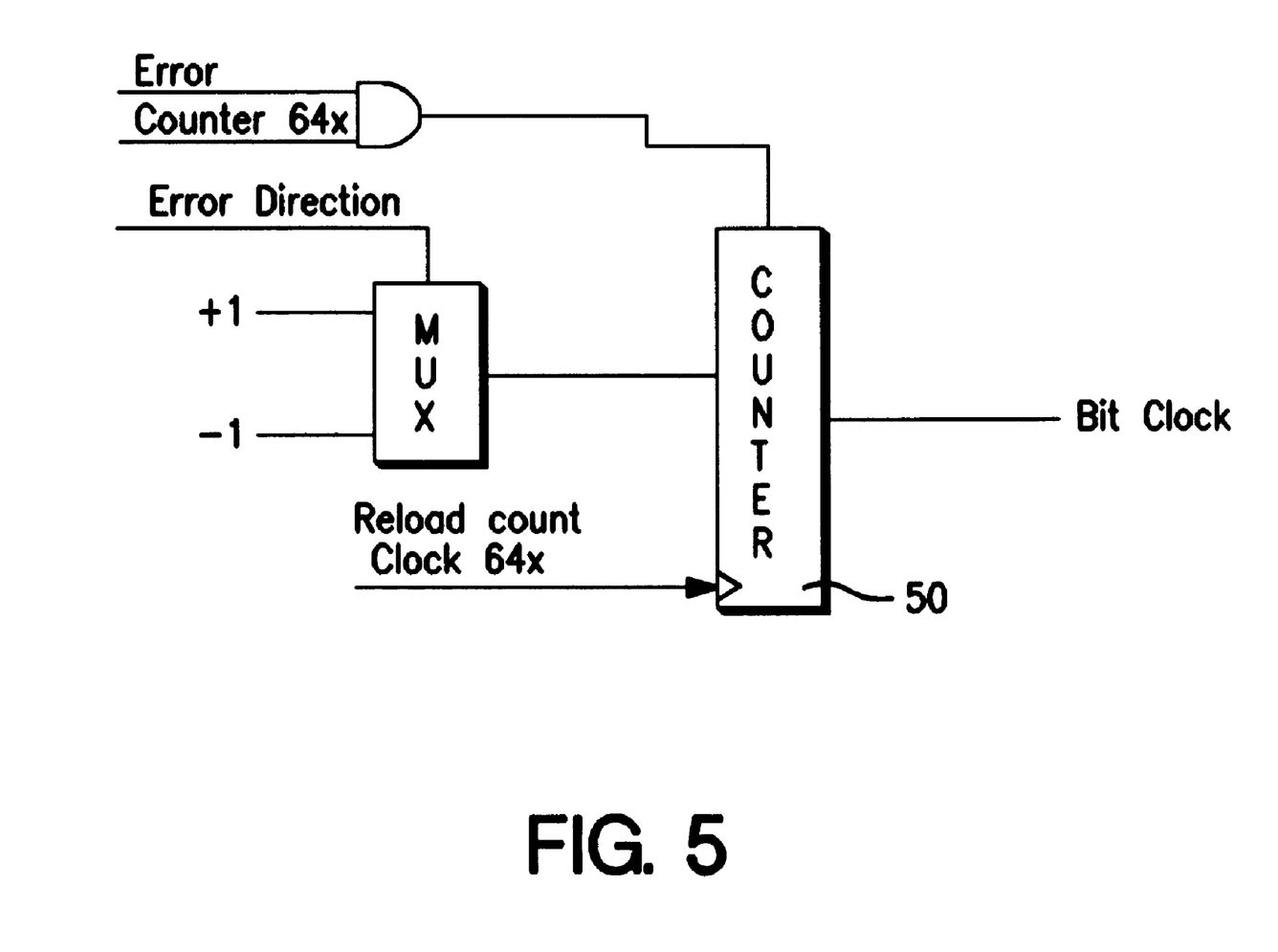
FIG. 5 is an illustration of a programmable divider included in the bit synchronizer 74.

In the exemplary system, since the data clock rate is known, the programmable divider of FIG. 5 is arranged to count over a one bit duration. Thus, the counter 50 is loaded with a count equal to the anticipated bit period. More specifically, the bit period is divided by 64 by counter 50 and the counter is clocked at a rate 64 times the known data rate so as to produce a bit clock closely synchronized with the data bit. That is to say that since it is known that the bit rate is about 1/64th of the 64× clock a divide by 64 process will produce a bit clock very close to the data rate. However, further adjustment of the produced bit clock pulse is necessary for proper alignment with the data bits. Accordingly, the programmable divider of FIG. 5 is adjusted, as needed, for each data transition such that if the generated bit clock is late with regard to the data transition, the programmable divider is set to 63. On the other hand, if the clock is determined to be early with respect to the data, the programmable divider is set to 65. Moreover, if no error as to the generated bit clock vis a vis the data transition is determined, the error is 0 and the programmable divider is set to 64.

As indicated above, the counter 50 is reloaded with an increased or decreased count only if necessary, i.e., when an error in alignment of data and bit clock is determined on a data transition. In this regard, the D-type flip-flops and Exclusive Or of FIG. 6 detects the bit transition as indicated in the timing diagram such that the programmable divider of FIG. 5 is updated via the circuitry of FIG. 7 only when a data transition is detected.

Figure 7:
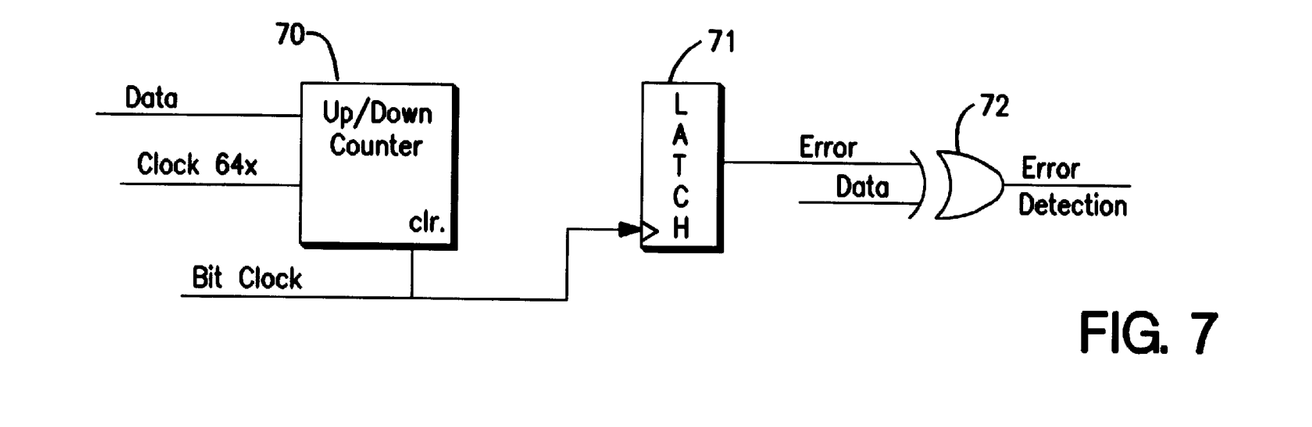
FIG. 7 is an illustration of an up/down counter and associated circuitry included in the bit synchronizer 74 for determining when the bit clock is early or late with respect to a transition in the data.
Figure 8A:
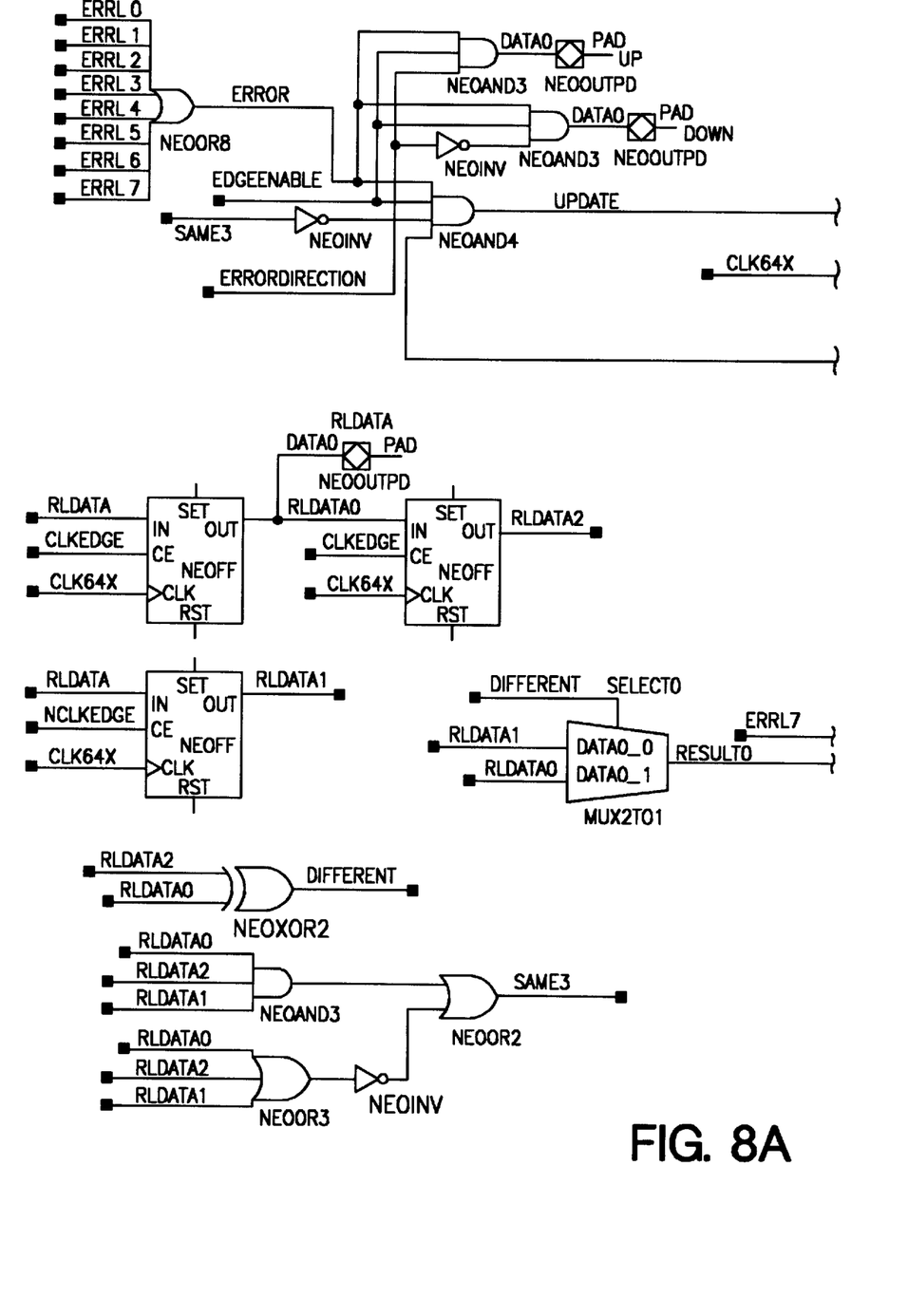
FIGS. 8–12 are detailed schematic diagrams of the circuitry included in the bit synchronizer 74 of FIG. 3.
Figure 8B:
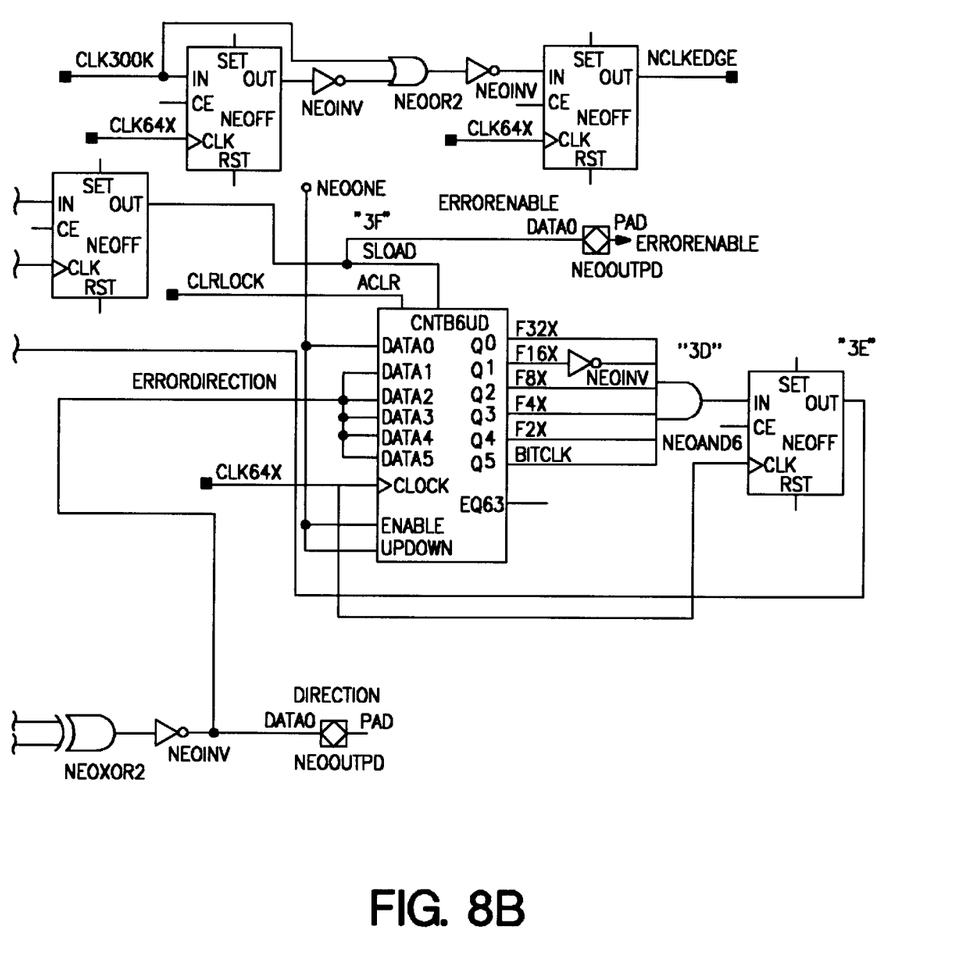
Figure 9:
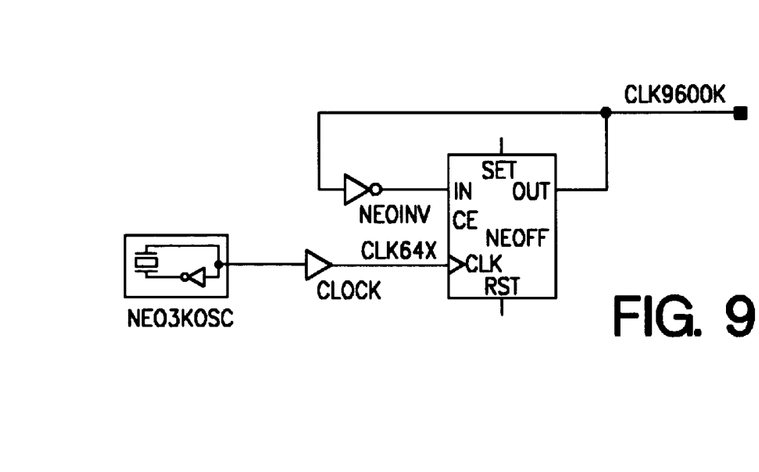
Figure 10:
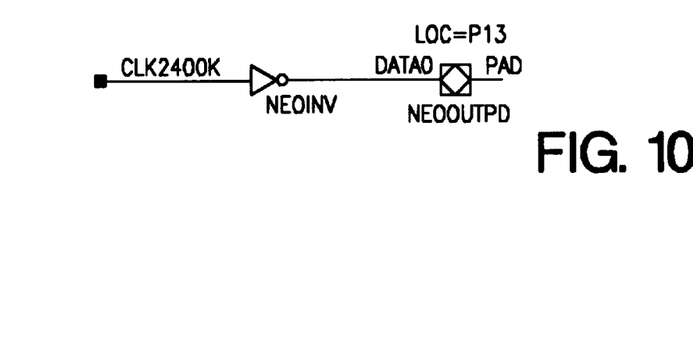
Figure 11:
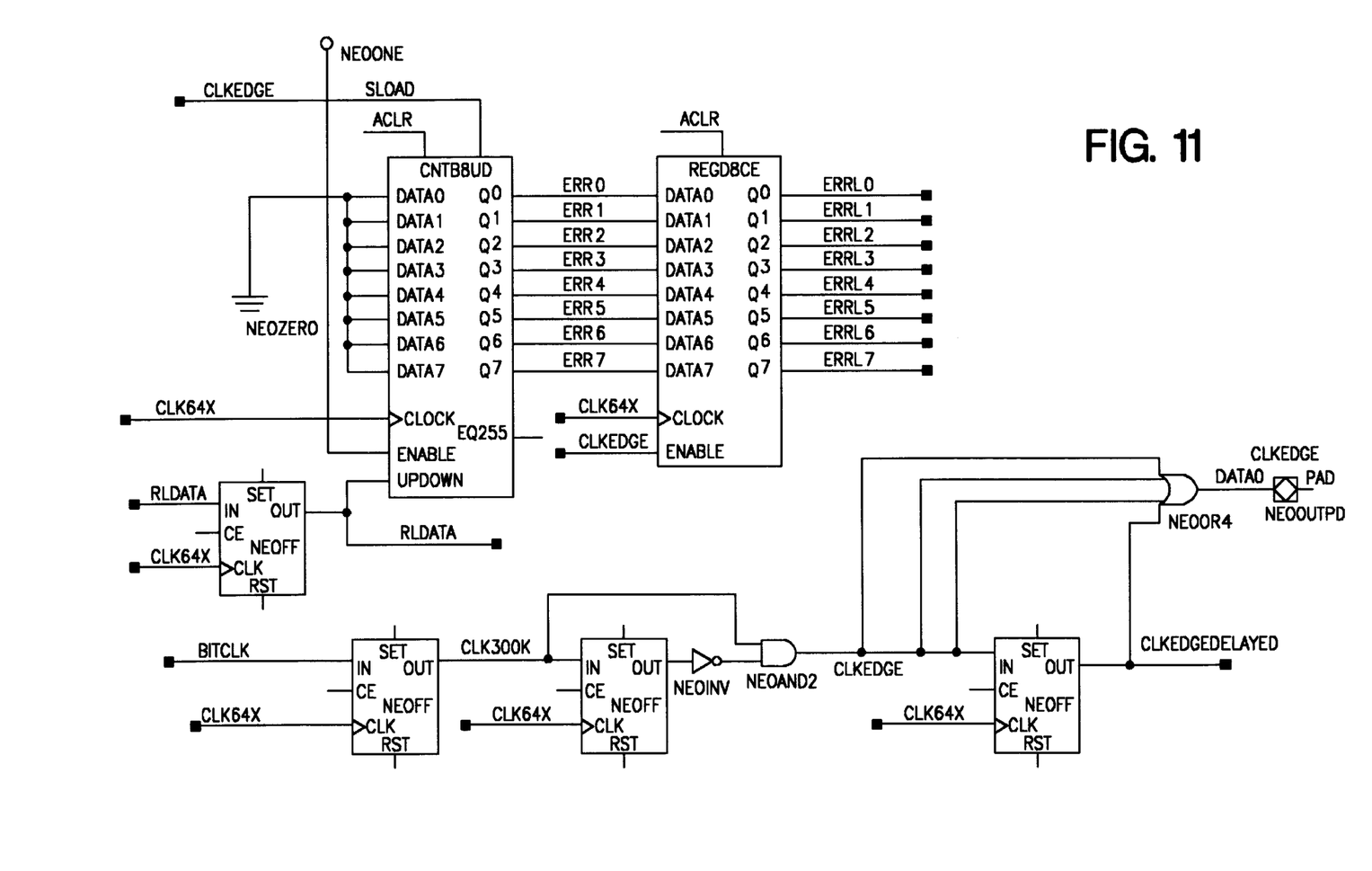
Figure 12:
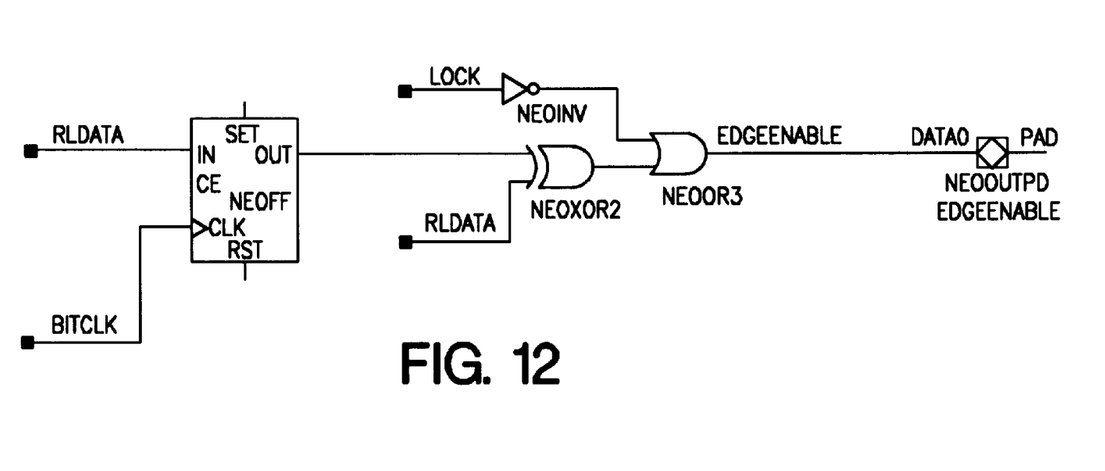

For the purpose of determining when the programmable divider of FIG. 5 is to be reloaded with an increased or decreased count, the up/down counter 70 and associated circuitry of FIG. 7 is used in order to determine whether the bit clock is early or late with respect to a data transition. In this regard, the up/down counter during a data bit time counts up or down depending on whether the data is positive or negative. Counter 70 is also clocked at a rate 64 times the data rate. Moreover, the counter 70 is reset to 0 by the bit clock produced by the programmable divider of FIG. 5. As illustrated in the timing diagram, the up/down counter values are an analog representation of the digital value found in the up/down counter as related to data transitions and the clock count. Thus, when the data is negative or 0, the counter counts down. When the data is positive, the counter counts up. Thus, the purpose of the up/down counter is to determine or measure where the clock is with respect to the transition in the data. The up/down counter output is latched in element 71. If no data transition occurs in the counting period or the up/down counter value is zero, no error signal is produced. However, if a value is latched to produce an error signal, the data value of the counter is combined in Exclusive Or 72 with the error signal whereby the data value which is positive or negative "steers" the error direction thus indicating that the clock is either early or late. The early or late error direction output of the element 72 is then used to program the divider of FIG. 5 to either add or delete from the 64 count value of counter 50. That is to say, once it is determined that the bit clock is early or late vis a vis a data transition, the nominal divide by 64 of programmable counter 50 is changed to either a 63 or a 65 depending on which direction the bit clock must be adjusted. However, as aforementioned the nominal divide by 64 in counter 50 is modified only if necessary when an early or late condition is determined.

Figure 6:
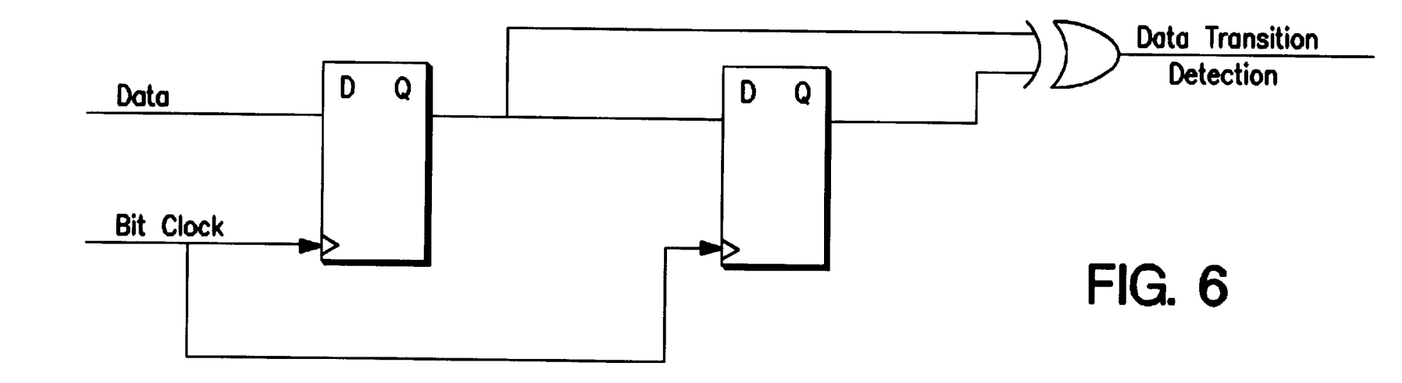
FIG. 6 is an illustration of a data transition detector included in the bit synchronizer 74.

Although the bit synchronization structure of element 74 of FIG. 3 has been explained with regard to the more detailed block diagrams of FIGS. 5–7, still further detailed schematic illustrations of the circuitry is found in FIGS. 8–12. It will be recognized however that what is illustrated at FIGS. 5–7 along with the timing diagram of FIG. 4 may be specifically implemented in several ways. Thus, that which is illustrated at FIGS. 8–12 is merely one manner of doing so.

Figure 13:
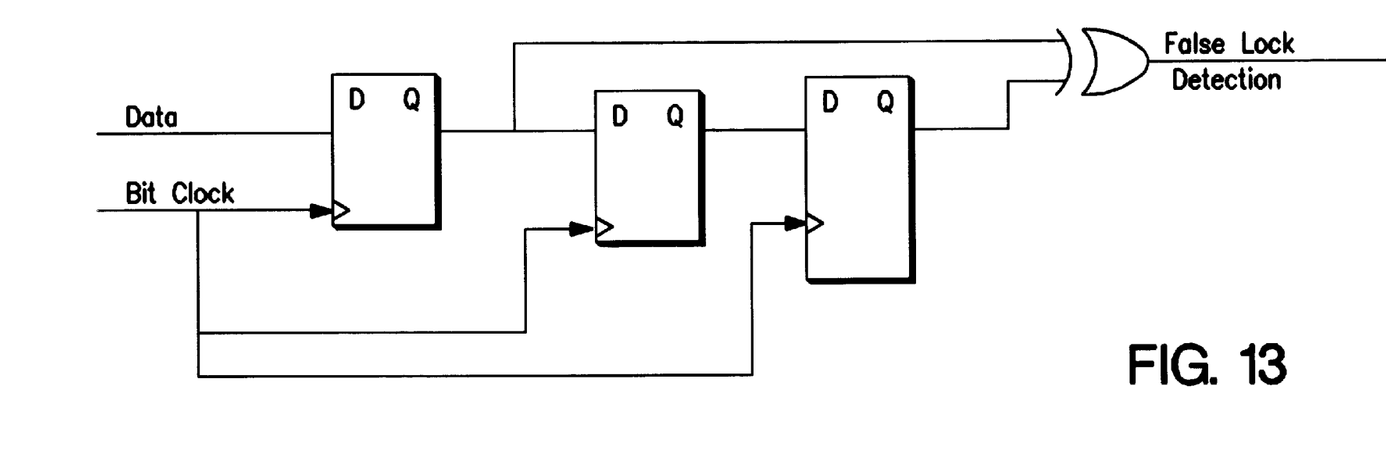
FIG. 13 is an illustration of a false lock detector which may occur at a 180° out of phase condition and asymmetrical data.

As an additional feature of the bit synchronizer element 74 of FIG. 3, a false lock detector is illustrated in FIG. 13. This detector comprising D flip-flops and an Exclusive Or is essentially a skew correction detector whereby if the duty cycle of the data is not 50% it may happen that a false lock going 180° out of phase will occur since the D flip-flops evaluate the clock from rising edge to rising edge and at the midpoint. Thus, it may be desirable to detect the skew or false lock for use in the bit synchronizer.

While the invention has been described in what is presently considered to be the most practical and preferred embodiments, it is understood that the appended claims are not to be limited to the disclosed embodiments, but on the contrary, are intended to cover modifications, variations and/or equivalent arrangements which would retain any of the novel features and advantages of the structure.

What is claimed is:

1. A bit synchronizer for an interrogator comprising:

a programmable divider for generating a bit clock for each bit of a bitstream, said divider including a first counter clocked at a rate which is a multiple of the bitstream rate;

a detector for determining whether the generated bit clock from the programmable divider is early or late with respect to a data transition in the bitstream and for producing an error direction signal indicative of an early or late bit clock, wherein said detector includes a second counter clocked at the same clock rate as said first counter and wherein the error direction signal is based on the counting of said second counter;

said programmable divider being responsive to the error direction signal for adding to or subtracting from a count in said first counter.

2. The bit synchronizer according to claim 1, wherein said second counter is an up/down counter having a counting period determined by the generated bit clock from said programmable divider.

3. The bit synchronizer according to claim 2, wherein the error direction signal is produced only if there is a data transition in the bitstream during the counting period of said up/down counter and if the count of said up/down counter is non-zero.

4. The bit synchronizer according to claim 3, further comprising a data transition detector for detecting a data transition in the bitstream, said data transition detector comprising:

a first D flip-flop circuit having its data input connected to the bitstream and its clock input connected to the generated bit clock from said programmable divider;

a second D flip-flop having its data input connected to a data output of said first D flip-flop and its clock input connected to the generated bit clock from said programmable divider; and an exclusive OR logic gate having one input connected to the data output of said first D flip-flop and another input connected to a data output of said second D flip-flop.

5. The bit synchronizer according to claim 1, wherein the count in said first counter is added to if the error direction signal is indicative of an early bit clock.

6. The bit synchronizer according to claim 1, wherein the count in said first counter is subtracted from if the error direction signal is indicative of a late bit clock.

7. The bit synchronizer according to claim 1, further comprising:

a false lock detector.

8. The bit synchronizer according to claim 1, wherein said second counter is reset by each bit clock from said programmable divider.

9. A bit synchronizer for an interrogator comprising:

a programmable divider for generating bit clocks for the bits of a bitstream, said programmable divider including a first counter which is loaded with counts corresponding to anticipated bit periods; and a detector for detecting whether the actual bit periods are greater than or less than the anticipated bit periods and for outputting error direction signals indicative of whether the actual bit periods are greater than or less than the anticipated bit periods, said detector including an up/down second counter having counting periods determined in accordance with the bit clocks, wherein the error direction signals are based on the counting of said up/down second counter and the counts loaded in said first counter are determined in accordance with the error direction signals.

10. The bit synchronizer according to claim 9, wherein the error direction signals are produced only for those counting periods during which there is a data transition in the bitstream and the count of said up/down second counter is non-zero.

11. The bit synchronizer according to claim 10, further comprising a data transition detector for detecting a data transition in the bitstream, said data transition detector comprising:

a first D flip-flop circuit having its data input connected to the bitstream and its clock input connected to the bit clocks from said programmable divider;

a second D flip-flop having its data input connected to a data output of said first D flip-flop and its clock input connected to the bit clocks from said programmable divider; and an exclusive OR logic gate having one input connected to the data output of said first D flip-flop and another input connected to a data output of said second D flip-flop.

12. The bit synchronizer according to claim 9, wherein the counts loaded in said first counter are increased if the error direction signals are indicative of early bit clocks.

13. The bit synchronizer according to claim 9, wherein the counts loaded in said first counter are decreased if the error direction signals are indicative of late bit clocks.

14. The bit synchronizer according to claim 9, wherein the up/down second counter is reset by each bit clock from said programmable divider.

15. A bit synchronizer for an interrogator comprising:

a programmable divider for generating bit clocks for the bits of a bitstream, said programmable divider including a first counter which is loaded with counts corresponding to anticipated bit periods and which is clocked at a rate that is a multiple of the bitstream rate; and a detector for detecting whether the actual bit periods are greater than or less than the anticipated bit periods and for outputting error direction signals indicative of whether the actual bit periods are greater than or less than the anticipated bit periods, said detector including an up/down second counter having a counting direction determined by the values of the bits of the bitstream and which is clocked at the same rate as said first counter, wherein the error direction signals are based on the counting of said up/down second counter during counting periods determined by the bit clocks from said programmable divider and the counts loaded in said first counter are determined in accordance with the error direction signals.

16. The bit synchronizer according to claim 15, wherein said up/down second counter is reset by each bit clock from said programmable divider.

17. The bit synchronizer according to claim 15, wherein the error direction signals are produced only for those counting periods during which there is a data transition in the bitstream and the count of said up/down second counter is non-zero.

18. The bit synchronizer according to claim 15, wherein the counts loaded in said first counter are increased if the error direction signals are indicative of early bit clocks.

19. The bit synchronizer according to claim 15, wherein the counts loaded in said first counter are decreased if the error direction signals are indicative of late bit clocks.

* * * * *